US012754225B2

(12) United States Patent
Handy et al.

(10) Patent No.: US 12,754,225 B2
(45) Date of Patent: Oct. 6, 2026

(54) APPARATUS AND METHOD TO DETECT AND LOCATE A FAULT IN A SHIELDED CONDUCTOR

(71) Applicant: GE Aviation Systems Limited, Cheltenham (GB)

(72) Inventors: Peter James Handy, Cheltenham (GB); Russell Mark Compton, Droitwich Spa (GB)

(73) Assignee: GE Aviation Systems Limited, Cheltenham (GB)

( * ) Notice: Subject to any disclaimer, the term of this patent is extended or adjusted under 35 U.S.C. 154(b) by 68 days.

(21) Appl. No.: 18/755,313

(22) Filed: Jun. 26, 2024

(65) Prior Publication Data

US 2025/0035694 A1 Jan. 30, 2025

(30) Foreign Application Priority Data

Jul. 26, 2023 (EP) .................................... 23187954

(51) Int. Cl.
*G01R 31/11* (2006.01)
*G01R 31/08* (2020.01)

(52) U.S. Cl.
CPC ............ *G01R 31/11* (2013.01); *G01R 31/086* (2013.01)

(58) Field of Classification Search
CPC .............................. G01R 31/11; G01R 31/086
See application file for complete search history.

(56) References Cited

U.S. PATENT DOCUMENTS 3,803,484 A 4/1974 Gray
4,104,582 A * 8/1978 Lambertsen ........... G01R 31/11 324/533
4,271,444 A 6/1981 Howell
4,301,399 A 11/1981 Miller et al.
4,471,294 A * 9/1984 Nielsen .................. G01R 31/08 324/642
4,887,041 A * 12/1989 Mashikian ............. G01R 31/11 324/541
5,272,439 A * 12/1993 Mashikian ............. G01R 31/11 324/520
6,011,399 A 1/2000 Matsumaru et al.
(Continued)

FOREIGN PATENT DOCUMENTS

CN 101615808 A 12/2009
CN 102608526 A 7/2012
(Continued)

*Primary Examiner* — Paresh Patel
(74) *Attorney, Agent, or Firm* — Thomas | Horstemeyer, LLP

(57) ABSTRACT

An apparatus and method to detect and locate electrical faults in an insulated supply conductor sheathed in a conductive screen is disclosed. The apparatus is positioned along the supply conductor between a power supply and an electrical load. The conductive screen is coupled to an electrical ground via a first resistive element. A voltage on the conductive screen is sensed and compared to a threshold to determine whether a fault condition exists. The apparatus is configured to inject a voltage pulse to the conductive screen and detect a reflected pulse therefrom. The location of the fault condition is determined based on an elapsed time between the injection of the voltage pulse and the detection of the reflected pulse.

19 Claims, 4 Drawing Sheets

(56) References Cited

U.S. PATENT DOCUMENTS

| | | | |
|---|---|---|---|
| 6,366,095 B1 | 4/2002 | Van Aartrijk | |
| 6,954,076 B2 | 10/2005 | Teich | |
| 7,512,503 B2 | 3/2009 | Bechhoefer et al. | |
| 7,623,329 B2 | 11/2009 | Williams et al. | |
| 7,868,621 B2 | 1/2011 | Liu et al. | |
| 8,022,711 B2 | 9/2011 | Oldenburg et al. | |
| 8,222,906 B2 | 7/2012 | Wyar et al. | |
| 8,593,153 B2 | 11/2013 | Medelius et al. | |
| 8,796,547 B2 | 8/2014 | Kukowski | |
| 9,305,731 B2 | 4/2016 | Schult et al. | |
| 9,425,614 B2 | 8/2016 | Xiong et al. | |
| 9,746,512 B2 | 8/2017 | Shipley | |
| 10,983,155 B2 | 4/2021 | Collins et al. | |
| 2001/0052778 A1 | 12/2001 | Smith | |
| 2005/0128661 A1 | 6/2005 | Maeckel et al. | |
| 2008/0108252 A1 | 5/2008 | Williams | |
| 2008/0243402 A1 | 10/2008 | Rene et al. | |
| 2009/0287426 A1* | 11/2009 | Kukowski | G01R 31/52 702/35 |
| 2011/0153235 A1 | 6/2011 | Thomas et al. | |
| 2011/0169498 A1 | 7/2011 | Shipley | |
| 2014/0292360 A1 | 10/2014 | Morgenstern et al. | |
| 2015/0214718 A1 | 7/2015 | Rubython et al. | |
| 2017/0023632 A1 | 1/2017 | Johnson et al. | |
| 2017/0234921 A1 | 8/2017 | Handy | |
| 2017/0259927 A1 | 9/2017 | Schram | |
| 2020/0103445 A1 | 4/2020 | Medina Garcia et al. | |
| 2022/0029411 A1 | 1/2022 | Collins et al. | |

FOREIGN PATENT DOCUMENTS

| | | | |
|---|---|---|---|
| CN | 103384446 | A | 11/2013 |
| DE | 10017455 | C2 | 1/2003 |
| EP | 1114752 | B1 | 10/2006 |
| EP | 1831706 | B1 | 4/2019 |
| EP | 3633812 | B1 | 7/2021 |
| JP | 2005045896 | A | 2/2005 |
| KR | 101095598 | B1 | 12/2011 |
| WO | 2016137424 | A1 | 9/2016 |

* cited by examiner

APPARATUS AND METHOD TO DETECT AND LOCATE A FAULT IN A SHIELDED CONDUCTOR

CROSS-REFERENCE TO RELATED APPLICATION(S)

This application claims priority to and the benefit of EP patent application Ser. No. 23/187,954.5, filed Jul. 26, 2023, the entirety of which is incorporated herein by reference.

TECHNICAL FIELD

This disclosure relates generally to fault detection and location, and more specifically to electrical fault detection and location in power cables.

BACKGROUND OF THE INVENTION

Commercial aircraft and other applications, including industrial, commercial and residential applications, typically include an electrical power distribution system. The purpose of the electrical power distribution system is to distribute electricity to loads, protect wires and loads from hazards, and to route the most appropriate power source to each load.

Such electrical power distribution systems typically include insulated conductive cables to transmit signals, such as power or data signals, from a source to a destination, such as a device or application. These cables are subject to damage or degradation through the life cycle of the power distribution system. For instance, wire chafing due to wire handling during maintenance operations, or wire corrosion due to exposure to humidity, can result in damage or degradation that can lead to a failure or fault in the cable. Typically, the device or application is taken offline to locate the fault within a length span of the cable, and provide for a repair.

DETAILED DESCRIPTION

Figure 1:
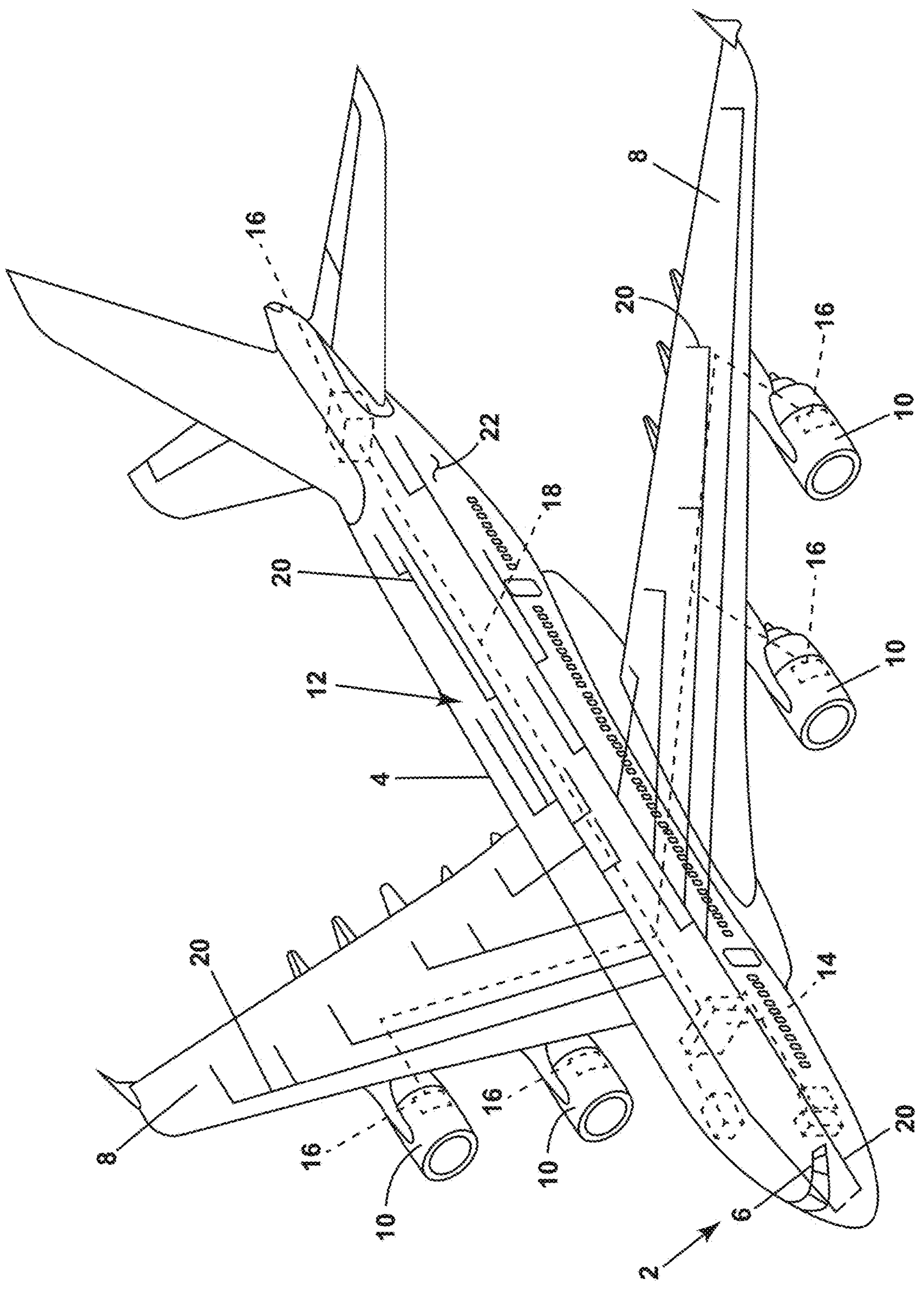
FIG. 1 is a schematic diagram of an aircraft with a power distribution system having wiring distributed throughout the aircraft.

Aspects of the present disclosure are directed to a fault detecting and locating apparatus. For purposes of illustration, the present disclosure will be described with respect to a power distribution system of an aircraft. The disclosure can have applicability in a variety of power distribution systems, and can be used to provide benefits in other industrial, commercial, military, and residential applications. Further non-limiting examples of other vehicles or engines to which the disclosure can relate can include boats, helicopters, cars, or other aquatic, air, space, or land vehicles. Industrial, commercial, or residential applications of the disclosure can include, but are not limited to, marine power plants, wind turbines, hybrid-electric machines, or small power plants. It will be understood, however, that the present disclosure is not so limited and can have general applicability in non-aircraft applications, such as other fault detecting requirements in non-aircraft power distribution applications.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all aspects described herein should be considered exemplary.

As used herein, the terms "first," "second," and "third" can be used interchangeably to distinguish one component from another and are not intended to signify location or importance of the individual components. The singular forms "a", "an", and "the" include plural references unless the context clearly dictates otherwise. Furthermore, as used herein, the term "set" or a "set" of elements can be any number of elements, including only one. All directional references (e.g., radial, axial, proximal, distal, upper, lower, upward, downward, left, right, lateral, front, back, top, bottom, above, below, vertical, horizontal, clockwise, counterclockwise, upstream, downstream, aft, etc.) are only used for identification purposes to aid the reader's understanding of the present disclosure, and do not create limitations, particularly as to the position, orientation, or use of the present disclosure.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other.

As used herein, elements being "electrically connected," "electrically coupled," or "in signal communication" include an electric transmission or signal being sent, received, or communicated to or from such connected or coupled elements. Furthermore, such electrical connections or couplings can include a wired or wireless connection, or a combination thereof. In non-limiting examples, connections or disconnections can be selectively configured to provide, enable, disable, or the like, an electrical connection between respective elements. Non-limiting example electrical connections or disconnections can be enabled or operated by way of switching, bus tie logic, or any other connectors configured to enable or disable the energizing of an electrical load downstream of the connection. Additionally, while terms such as "voltage", "current", and "power" can be used herein, it will be evident to one skilled in the art that these terms can be interrelated when describing aspects of the electrical circuit, or circuit operations.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

As used herein, a "controller", for example, "control module", "regulator module", "integrator module" includes a component configured or adapted to provide instruction, control, operation, or any form of communication for operable components to affect the operation thereof. Such controllers or modules can include any known processor, microcontroller, or logic device, including, but not limited to: Field Programmable Gate Arrays (FPGA), a Complex Programmable Logic Device (CPLD), an Application-Specific Integrated Circuit (ASIC), a Full Authority Digital Engine Control (FADEC), a Proportional Controller (P), a Proportional Integral Controller (PI), a Proportional Derivative Controller (PD), a Proportional Integral Derivative Controller (PID), a hardware-accelerated logic controller (e.g. for encoding, decoding, transcoding, etc.), the like, or a combination thereof. While described herein as comprising separate elements, in non-limiting aspects such controllers and modules can be incorporated on one or more devices including a common device, such as a single processor or microcontroller. Non-limiting examples of such controllers or module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module, regulator module, or integrator module can also include a data storage component accessible by the processor, including memory, whether transition, volatile or non-transient, or non-volatile memory. Additional non-limiting examples of the memory can include Random Access Memory (RAM), Read-Only Memory (ROM), flash memory, or one or more different types of portable electronic memory, such as discs, DVDs, CD-ROMs, flash drives, Universal Serial Bus (USB) drives, the like, or any suitable combination of these types of memory. In one example, the program code can be stored within the memory in a machine-readable format accessible by the processor.

Additionally, the memory can store various data, data types, sensed or measured data values, inputs, generated or processed data, or the like, accessible by the processor in providing instruction, control, or operation to effect a functional or operable outcome, as described herein. In another non-limiting example, a control module can include comparing a first value with a second value, and operating or controlling operations of additional components based on the satisfying of that comparison. For example, when a sensed, measured, or provided value is compared with another value, including a stored or predetermined value, the satisfaction of that comparison can result in actions, functions, or operations controllable by the controller module. As used herein, the term "satisfies" or "satisfaction" of the comparison means that the first value satisfies the second value, such as being equal to or less than the second value, or being within the value range of the second value. It will be understood that such a determination may easily be altered to be satisfied by a positive/negative comparison or a true/false comparison. Example comparisons can include comparing a sensed or measured value to a predetermined threshold value or threshold value range.

As used herein, the term "electrically insulative" or "insulator" refers to a material that exhibits a low electrical conductivity (for example, less than about 10-8 siemens per meter (S/m)).

As used herein, the term "ground" or "electrical ground", or "system ground" refers to a reference point in an electrical circuit from which voltages can be measured or referenced. As used herein a "ground" will provide a common return path for electric current. For example, in the context of a power system in an aircraft, in some instances, the "electrical ground" can be an internal metallic chassis, or the exterior frame of body of the aircraft itself. It will be appreciated that elements coupled to electrical ground via a resistive element or impedance are considered electrically isolated with respect to electrical ground.

Also, as used herein, sensors can be described as "sensing", "monitoring" or "measuring" a respective value. As used herein, the sensing, monitoring, or measuring includes determining a value indicative of, or related to, the respective value, rather than directly sensing or measuring the respective value itself. The sensed, monitored, or measured values can further be provided to additional components. For instance, a signal indicative of a particular sensed, monitored, or measured value can be provided to a controller module or processor, and the controller module or processor can perform processing based on the signal to determine a representative value or an electrical characteristic representative of said value.

The disclosed aspects can be implemented in any electrical circuit environment having a switch and adapted or configured to determine impedance or electrical fault characteristics in a conductor or electrical load during normal transmission operations (e.g. while the electrical circuit is powering the electrical load or while data transmission is occurring). Stated another way, the disclosure can be implemented while the electrical circuit is in operational use for its intended purpose, and the circuit does not have be "removed" for normal or routine operations to perform the determination. For example, a power distribution system in "test mode" or "maintenance operations" is not "in operational use," whereas power distribution system of an aircraft during flight and powering a set of electrical loads by way of the power distribution system is "in operational use."

In many cases, conventional aircraft and industrial applications can be electrically noisy environments. The electrical noise can typically be either radiated or conducted as electromagnetic interference (EMI), and can disrupt the proper operation of connected and nearby equipment. Typically, conductive power cables can be a main source of transfer for EMI, both as a source and receiver. As a source, a cable can either conduct EMI to nearby equipment or act as an antenna radiating noise. As a receiver, the cable can receive or pick up EMI radiated from other sources. While electrical insulation on conductors (e.g., cables) can protect the conductors mechanically from abrasion and environmentally from moisture, electrical insulation is transparent to electromagnetic energy and offers no protection or shielding from EMI. Accordingly, conventional power distribution circuits often use so called "shielded cables", or "sheathed cables". The shielded cables typically have a central signal- or power-carrying primary conductor disposed within an electrically insulative outer layer, and further surrounded by an EMI shielding layer to reduce the effects of EMI. Typically, the shielding layer surrounds the insulated primary conductor and can reduce the EMI by reflecting the energy, conducting it to ground, or both.

Conventional shielded cables typically employ a foil shield, a braided (or mesh) conductive shield, or a combination thereof. Foil shielding is typically a thin layer of a conductor (e.g., aluminum), attached to an insulative carrier (e.g., polyester), and circumferentially surrounds the primary conductor or wire. Braided conductive shielding is typically a woven mesh formed as a tubular sheath of bare or tinned copper wires that provides a low-impedance path (e.g., short-circuit) to ground. In some cases, an unshielded insulated cable can be routed through a braided conductive sheath or screen, which can act as an EMI shield. A low-impedance drain wire is typically connected to the sheath to electrically couple or short-circuit the sheath directly to ground.

Shielded cables can reduce wire damage in the event of an electrical fault, and can further enable deterministic fault detection. For example, a time domain reflectometry (TDR) device is commonly employed to locate faults or interruptions (e.g., an open circuit) in sheathed cables. TDR devices are typically arranged to sense or measure a reflection or echo of a low-voltage pulse or incident signal provided to the inner primary conductor in a shielded cable. In order to measure those reflections, the TDR device will transmit an incident signal onto the conductor and listen for its reflections. If the conductor is of a relatively uniform impedance along its length there will be no reflections. Conversely, if there are impedance variations such as a discontinuity in the conductor, then some of the incident signal will be reflected from the discontinuity back to the TDR device. The impedance of the discontinuity can be determined from the amplitude of the reflected signal. The distance to the reflecting impedance can also be determined from the time that the reflected signal takes to return.

For example, a conventional TDR device can have two leads; one lead is connected to the primary conductor, and the other lead is connected to the conductive sheath which is electrically coupled to ground. The primary conductor, and the surrounding conductive sheath can be considered two conductors in parallel. Typically, the TDR device will send a low voltage pulse into the primary conductor, and will sense a reflected signal returned to the TDR device. The reflection of the low voltage pulse is caused by a change of impedance, such as an interruption or discontinuity between the two parallel conductors (e.g., primary conductor and grounded conductive sheath). For example, the low voltage pulse travels from the TDR device through the primary conductor and will be reflected positively at any interruption point (open circuit) in the primary conductor, or at the cable end, and will be reflected negatively at a short circuit point in the primary conductor.

Conventional TDR devices can additionally be used to identify a location of a fault or interruption in the primary conductor. For example, TDR devices typically measure an elapsed time between a release of the low voltage pulse at a known propagation velocity, and a return (i.e., the reflection) of the low voltage pulse back to the TDR device. By knowing the propagation velocity and measuring the elapsed time, the distance to the reflection (e.g., an interruption or fault location) can easily be calculated.

However, in some cases, locating the fault in a shielded cable using conventional techniques can be challenging. For example, it is typically necessary to disconnect the cables associated with a fault in order to employ electronic devices such as conventional TDR devices to locate the fault. Additionally, conventional devices and techniques often don't provide sufficiently accurate indications of the fault location due to uncontrolled impedances and non-constant velocity of propagation in conventional unshielded power feeder cables. Furthermore, the process of disconnecting and disturbing cable harnesses can also result in the introduction of more faults. It would be desirable therefore, to have an improved device and method to detect and locate faults in power transmission cables while in operational use. For example, a device to detect and locate a fault along the wiring within the power distribution system, without need to disconnect the wiring from the power source or load, can be beneficial for maintenance and safety. Aspects of the present disclosure discussed herein provide an improved detection and location system for faults in electrical power transmission wires or cables, such as in an aircraft. A non-limiting example of an electrical environment that can include aspects of the disclosure can include an aircraft power system architecture, which enables production of electrical power from at least one spool of a turbine engine, preferably a gas turbine engine, and delivers the electrical power to a set of electrical loads via at least one solid state switch, such as a solid-state power controller (SSPC) switching device.

As used herein, TDR refers to a method or device for measuring reflections of a waveform or signal along a shielded conductor. TDR can include transmitting a pulse signal (e.g., an "incident signal") onto the conductor, and then detecting, receiving, measuring, or the like, a reflection of the incident signal (e.g., a "reflected incident signal"). Based on various parameters the location of a fault in the conductor can be determined. Such parameters can include, without limitation, the velocity of propagation (VoP) of the incident signal, the impedance of the conductor, the time to receive the reflection of the incident signal, the length of the conductor or end point of the conductor (e.g., the electrical load), the end point, a fault location, or combinations thereof.

Reference will now be made in detail to present aspects of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

FIG. 1 illustrates an aircraft 2 which can also include a fuselage 4, a cockpit 6 positioned in the fuselage 4, and wing assemblies 8 extending outward from the fuselage 4. The aircraft 2 can also include multiple engines, including turbine engines 10 which by way of non-limiting example can be turbojet engines, turbofan engines, or turboprop engines. While a commercial aircraft 2 has been illustrated, it is contemplated that aspects of the disclosure described herein can be used in any type of aircraft 2. Further, while two turbine engines 10 have been illustrated on each of the wing assemblies 8, it will be understood that any number of turbine engines 10 including a single turbine engine 10 on the wing assemblies 8, or even a single turbine engine mounted in the fuselage 4 can be included.

A power distribution system 12 is illustrated in phantom. A power distribution unit 14 can be coupled to at least one generator 16 by a main power feed 18 in order to receive electrical power. It is contemplated that the power distribution unit 14 can be coupled to a plurality of generators 16 as illustrated. The power distribution unit 14 can then distribute power via electrical wires 20 throughout the aircraft depending on load requirements for different operating systems. An aircraft structure 22 (e.g., a chassis, or fuselage) can be utilized as a return wire (e.g., a system ground) for certain operating systems. It should be understood that other unit arrangements for different aircraft engine arrangements would also benefit from the disclosure aspects disclosed herein and that the exemplary electrical wires 20 are for illustrative purposes only and not meant to be limiting.

Figure 2:
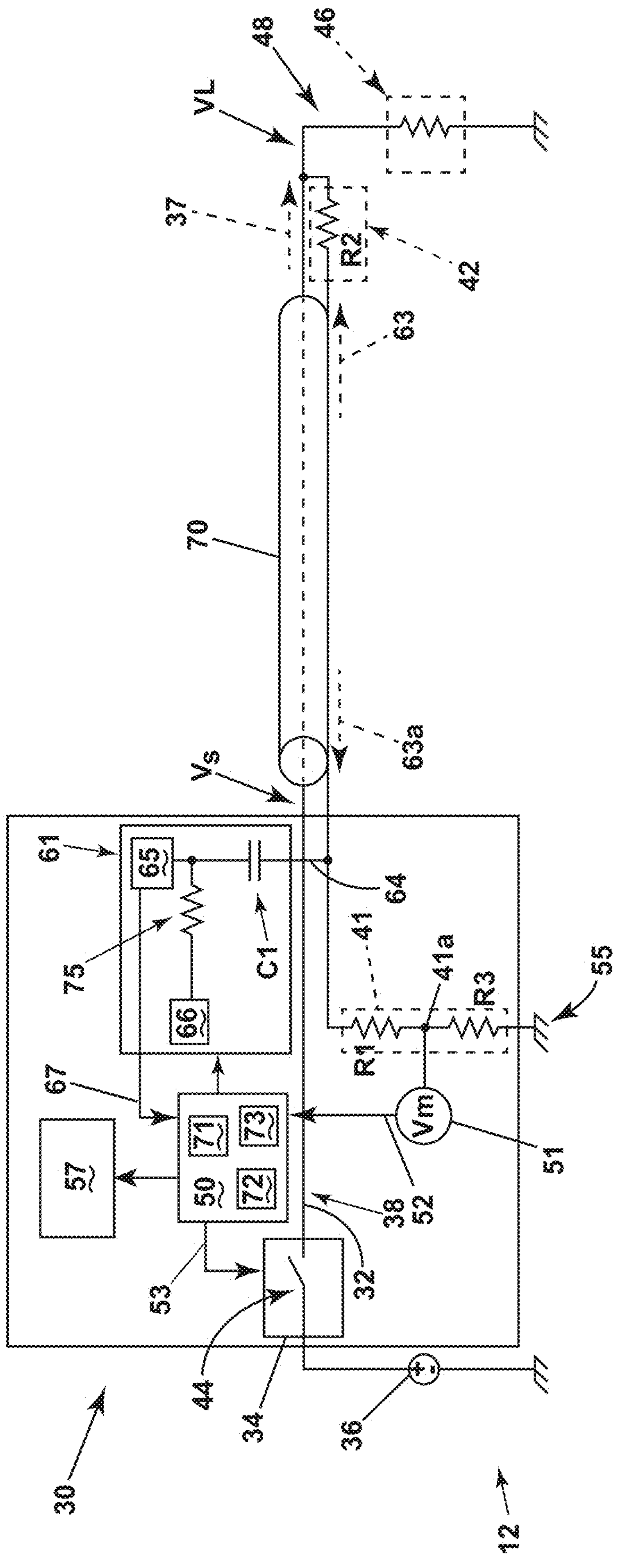
FIG. 2 is a schematic diagram of a fault detecting and locating apparatus in accordance with aspects as described herein.

FIG. 2 is an exemplary fault detection and locating apparatus 30 that can be used in the power distribution system 12. The power distribution system 12 can include a power supply 36 configured to provide a supply voltage Vs to an electrical load 46 such as a resistive load via an insulated supply conductor 32. The electrical load 46 can be any type of electrical load, for example in the aircraft, including but not limited to auxiliary hydraulic pumps, fuel boost pumps, lighting, avionics, ice and rain protection, commercial loads, and cargo loading.

The power supply 36 can include any number of power sources or aircraft architecture topologies and can be associated with multiple voltages. By way of non-limiting example, a 28 Vdc or 270 Vdc system can be distributed by the insulated supply conductor 32 and returned through an electrical ground 55. In other non-limiting aspects, the power supply 36 can be a 115 Vac system, and can either be distributed as a three phase or a single phase and returned through the electrical ground 55.

In non-limiting aspects, the power supply 36 can be selectively coupled via the switch 44 to the insulated supply conductor 32 to provide the supply voltage Vs to the electrical load 46. The fault detection and locating apparatus 30 can be coupled to the insulated supply conductor 32 between the power supply 36 and the electrical load 46. It will be appreciated that, in operation, the supply voltage Vs provided to the insulated supply conductor 32 at a supply end 38 can result in a load voltage VL at a load end 48.

The fault detection and locating apparatus 30 can be provided at any appropriate location along supply conductor 32. The fault detection and locating apparatus 30 can be electrically coupled to the electrical load 46, via the insulated supply conductor 32. A first conductive screen 70 or shield circumferentially surrounds and is spaced from the insulated supply conductor 32 by an insulator (not shown) disposed between the insulated supply conductor 32 and the first conductive screen 70.

The fault detection and locating apparatus 30 can include a control module 50, a protection device 34, a first reflectometry module 61, a first voltage sensor 51, a first reflection line 64, a first resistive element 41, and a second resistive element 42. The first reflectometry module 61 can include a first signal generator 66 and a first pulse detector 65. The first reflectometry module 61 can be electrically coupled to the first conductive screen 70. The first signal generator 66 is configured to generate a first incident signal 63 (indicated by dashed arrow), such as a voltage pulse. The pulse detector is configured to detect a first reflected signal 63*a*. The first reflected signal 63*a* (indicated by dashed arrow) can be a portion of the first incident signal 63 that is reflected back toward the first reflectometry module 61 (e.g., due to a fault condition). The first pulse detector 65 is communicatively coupled to the control module 50 via a communication line 67.

The fault detection and locating apparatus 30 can be electrically coupled to the power supply 36 to receive the supply voltage Vs with respect to the electrical ground 55 or return path therefrom. The protection device 34, first reflectometry module 61 and first voltage sensor 51 can be communicatively coupled with the control module 50. The fault detection and locating apparatus 30 can optionally be communicatively coupled to a user interface 57 such as a display or monitor. The user interface 57 can be in a remote location physically separate from other portions of the fault detection and locating apparatus 30.

The insulated supply conductor 32 can be a conventional insulated electrically conductive cable or wire. For example, in one non-limiting aspect, the insulated supply conductor can comprise a M27500 Component Wire SAE WC27500 cable. In other non-limiting aspects, the insulated supply conductor 32 can be insulated using any desired electrical insulation or dielectric material without departing from the scope of the disclosure. In non-limiting aspects, the insulated supply conductor 32 can comprise any desired size (e.g., American Wire gauge (AWG)) cable, and can range, for example, from 1 AWG to 26 AWG. The insulated supply conductor 32 can extend between a first end and a second end where the first end is the load end 48 at the electrical load 46, and the second end is the supply end 38 at the power supply 36. The load end 48 can be at an opposing end of the insulated conductor 32 from the supply end 36.

The insulated supply conductor 32 can be coupled to the protection device 34 at the supply end 38. The protection device 34 can be electrically coupled between the power supply 36 and the insulated supply conductor 32. The protection device 34 can be communicatively coupled with the control module 50. The protection device 34 can include a switch 44 such as a circuit breaker, contactor, solid-state power controller (SSPC), and the like. In some non-limiting aspects, the protection device 34 can include a transistor (not shown).

The first conductive screen 70 can circumferentially surround the insulated supply conductor 32 and can extend from the supply end 38 to the load end 48. In non-limiting aspects, the insulated supply conductor 32 and the first conductive screen 70 can be embodied in a conventional shielded insulated cable. However, as described herein, unlike conventional reflectometry arrangements, the first conductive screen 70 can be electrically isolated from electrical ground 55 (e.g., the aircraft structure 22 or chassis) via a predetermined relatively high-impedance path.

The control module 50 can include a processor 71, a memory 72, and a communications module 73. The control module 50 can be a system of controllers or a single controller. In some non-limiting aspects, the control module 50 can include an SSPC. The processor 71 can be configured to perform a variety of computer-implemented functions and/or instructions (e.g., performing the methods, steps, calculations and the like and storing relevant data as disclosed herein). The instructions, when executed by the processor 71, can cause the processor 71 to perform operations, as described herein. The control module 50 can be communicatively coupled to one or more of the protection device 34, first reflectometry module 61, first signal generator 66, and first pulse detector 65 and be configured to control a respective operation thereof.

The first signal generator 66 and first pulse detector 65 can be electrically coupled to the first conductive screen 70 at the supply end 38 via the first reflection line 64. Optionally, an isolation capacitor C1 can be coupled electrically in series along the first reflection line 64. In non-limiting aspects, a first source impedance 75, having a known or predetermined value, can be coupled electrically in series between the first signal generator 66 and the first conductive screen 70. The value of the first source impedance 75 can be selected based on an impedance of the first conductive screen 70. While aspects of the first signal generator 66 can comprise a standard step or pulse signal generator, it will be appreciated that non-limiting aspects can alternatively comprise other drivers or signal generators as desired without departing from the scope of the disclosure. For example, in other aspects, the first reflectometry module 61 can include, or be adapted to include, a more complex driver arrangement such as frequency domain reflectometry (FDR), spread-spectrum time-domain reflectometry (SSTDR), noise domain reflectometry (NDR), and the like, without departing from the scope of the disclosure.

The first resistive element 41 is coupled electrically in series between the first conductive screen 70 at the supply end 38 and electrical ground 55 which can be, way of non-limiting example, the aircraft structure 22 (e.g., a chassis). The first resistive element 41 can define a relatively high impedance path from the first conductive screen 70 to electrical ground 55. In non-limiting aspects, the first resistive element 41 can be a first voltage divider comprising a first resistor R1 of known resistance coupled electrically in series with a third resistor R3 of known resistance at a node 41*a*. The first conductive screen 70 can be said to be coupled via a high-impedance path to electrical ground 55 via the first resistive element 41.

The second resistive element 42, such as a first resistor R2 of known resistance, is electrically coupled to the insulated supply conductor 32 at the load end 48 and to the first conductive screen 70 at the load end 48. The first voltage sensor 51 is arranged to detect, measure, or otherwise sense a measured voltage Vm indicative of a voltage on the first conductive screen 70. For example, in non-limiting aspects, the first voltage sensor 51 can be electrically coupled in parallel with the first resistor R1 such that a voltage across the first resistor R1 can be sensed as the measured voltage Vm during operation.

In operation, the fault detection and locating apparatus 30 can determine whether a fault condition exists with respect to the insulated supply conductor 32, the first conductive screen 70, or both. When the fault detection and locating apparatus 30 determines a fault condition exists between the insulated supply conductor 32 and the first conductive screen 70, the fault detection and locating apparatus 30 is further configured determine a location of the fault condition. For example, in non-limiting aspects, the fault detection and locating apparatus 30 can be configured to determine whether a fault condition exists on the insulated supply conductor 32 or the first conductive screen 70, or both, based on a comparison of a measured voltage Vm to a reference voltage Vr or threshold (not shown). The reference voltage Vr or threshold can be predetermined and saved in memory 72. In one non-limiting example, during normal operation, the power supply 36 is operative to provide a known value of the supply voltage Vs with respect to electrical ground 55 to the electrical load 46 via the insulated supply conductor 32. A current (indicated by dashed arrow, 37) supplied to the electrical load 46 can be a known amount based on the known supply voltage Vs, known electrical load 46, and known values of the first and second resistive elements 41, 42. The respective resistance values of the first and second resistive elements 41, 42 can be predetermined or selected based on a calculated or determined reference voltage Vr (not shown). The reference voltage Vr can be calculated, derived, or otherwise determined based on the known supply voltage Vs at the supply end 38, and load voltage VL at the load end 48. For example, the reference voltage Vr can be a fraction of the amount of the supply voltage Vs or load voltage VL at the supply or load ends 38, 48. For example, in non-limiting aspects, the reference voltage Vr can be ⅓ of the supply voltage Vs. In other non-limiting aspects, the reference voltage Vr can be ⅓ of the load voltage VL at the load end 48. In some aspects, the reference voltage Vr can be defined by a range. It will be appreciated that since the reference voltage Vr is based on the supply voltage Vs and load voltage VL, the value of the reference voltage Vr will depend on the particular circuit to which the first voltage sensor 51 is connected, and can therefore be any desired voltage or range of voltages in various aspects In operation, the first voltage sensor 51 measures or senses the measured voltage Vm for example, by sensing the measured voltage Vm across the first resistor R1. The measured voltage Vm across the first resistor R1 can be indicative of the voltage on the first conductive screen 70. The first voltage sensor 51 can sense a value of the voltage Vm, and provide a first signal 52 indicative of the sensed value of the voltage Vm to the control module 50.

In some non-limiting aspects, under normal operating conditions, the measured voltage Vm can satisfy or be equal to the reference voltage Vr. However, in an event where the insulated supply conductor 32 or first conductive screen 70 is damaged or broken, the measured voltage Vm may no longer equal to the reference voltage Vr. For example, in an event where the insulated supply conductor 32 is damaged or broken, a high impedance or series arc fault can occur. In this instance, the measured voltage Vm will be less than the reference voltage Vr. In an event where the first conductive screen 70 is damaged or broken, a short circuit to ground will occur. In this instance, the measured voltage Vm will be less than the reference voltage Vr. In an event where the insulated supply conductor 32 includes a short circuit to ground, the measured voltage Vm will have a value that is less than the reference voltage Vr. In an event where the insulated supply conductor 32 is damaged and the damaged portion is within the first conductive screen 70, a parallel arc can occur. In this instance, the measured voltage Vm will be greater than the reference voltage Vr.

In such events of a fault or failure event of the insulated supply conductor 32, the first voltage sensor 51 will sense a measured voltage Vm that deviates from the reference voltage Vr. In this sense, the reference voltage Vr can be considered as a threshold voltage. In an aspect, the control module 50 can be configured to determine the occurrence of a fault event or condition based on the value of Vm indicated by the first signal 52, for example by comparing the value of Vm indicated by the first signal 52 to a threshold value such as the reference voltage Vr, that can be stored in memory 72. For example, the control module 50 can compare the value of the measured voltage Vm to the reference voltage Vr or threshold and determine a fault condition exists when the value of the measured voltage Vm deviates from the value of reference voltage Vr, or the threshold is otherwise satisfied. The threshold can be selected to be a predetermined level to minimize false or inadvertent indications of a fault condition by the control module 50. For example, the control module 50 can be configured to determine a fault condition exists only if the measured voltage Vm deviates from the reference voltage Vr more than a predetermined threshold amount.

In the event the control module 50 determines a fault condition exists, the control module 50 can further provide an instruction to the user interface 57 to display or otherwise indicate the fault condition exists. For example, the indication that a fault condition exists can be one of a light, an audible signal, or a processor output. In non-limiting aspects, the indication that a fault condition exists can include a value of the measured voltage Vm.

Additionally, or alternatively, in non-limiting aspects, in the event the control module 50 determines a fault condition exists, the control module 50 can be further configured to send a second signal 53 to the protection device 34 to cause the protection device to trip or transition from a closed or conducting state to an open or non-conducting state. For example, responsive to the second signal 53 received from the control module 50, the switch 44 can be switchable between an open state or closed state (not shown). It will be appreciated that when the switch 44 is in the closed state, the supply voltage Vs is conveyed to the insulated supply conductor 32, and when the switch is in the open state, the supply voltage Vs is cut-off or blocked from the insulated supply conductor 32 and the electrical load 46. The events described herein are for illustrative purposes only and not meant to be limiting. The events can be any event in which a fault in the insulated supply conductor 32 has been detected.

In the event the control module 50 determines a fault condition exists, the control module 50 can be further configured to determine a location of the fault condition. For example, in non-limiting aspects, in the event the control module 50 determines a fault condition exists, the control module 50 can be further configured to trigger an injection of the first incident signal 63 by the first signal generator 66 to the first conductive screen 70. The first signal generator 66 can provide the first incident signal 63 to the first conductive screen 70 via the first reflection line 64. In non-limiting aspects, the first incident signal 63 can be provided through the first source impedance 75, or isolation capacitor C1, or both. The characteristics of the first incident signal 63 can be predetermined or selected based on any number of parameters specific to the particular power distribution system 12, supply conductor 32, first conductive screen 70, or combinations thereof. It is contemplated that the first incident signal 63 can comprise any desired predetermined duration (e.g., 2.3 milliseconds), rise time (e.g., 20 picoseconds), shape (e.g., square, rectangular, gaussian, etc.), and amplitude (e.g., 5 volts) without departing from the scope of the disclosure.

The first incident signal 63 will propagate at a known or predetermined velocity of propagation on the first conductive screen 70 toward the electrical load 46. As will be appreciated, when there is a fault condition on the insulated supply conductor 32, the conductive screen, or both, a portion of the first incident signal 63 will reflect back to the first reflectometry module 61 from the fault as a first reflected signal 63*a*. In non-limiting aspects, the isolation capacitor C1 can block DC signals, but allow the first reflected signal 63*a* to pass through to the first pulse detector 65. The first reflected signal 63*a* can be detected by the first pulse detector 65. The first reflectometry module 61 can provide an indication of the first reflected signal 63*a* to the control module 50. In non-limiting aspects, the indication of the first reflected signal 63*a* can include an indication of the waveform or other characteristics of the first reflected signal 63*a*, or an indication of an elapsed time between the injection of the first incident signal 63 and the detection of the first reflected signal 63*a*, or both.

Based on the indication of the first reflected signal 63*a*, the control module 50 can be configured to determine a first elapsed time between the injection of the first incident signal 63 and the detection of the first reflected signal 63*a*. The control module 50 can further determine a location of the fault condition based on the first elapsed time. In non-limiting aspects, the control module 50 can additionally, or alternatively, provide an instruction to the user interface 57 to display information indicative of the first reflected signal 63*a* (e.g., the waveform of the first reflected signal 63*a*), the elapsed time or both. For example, the information can include a determined location of the fault condition with respect to the insulated supply conductor 32. In some aspects, a user can determine the location of the fault condition by viewing the information displayed by the user interface 57. In non-limiting aspects, the control module 50 can additionally, or alternatively, provide an instruction to the user interface 57 to display information indicative of the indication of the second reflected signal 183*a*. In some aspects, a user can determine the location of the fault condition by viewing the information displayed by the user interface 57.

While the aspect of FIG. 2 is discussed for case of understanding, with respect to a detection and location of a fault on a single insulated supply conductor 32 surrounded by a first conductive screen 70, other aspects are not so limited. For example, other aspects contemplate fault detection and location on a shielded cable disposed with a set of shielded cables within an electrically conductive overbraid or screen.

Figure 3:
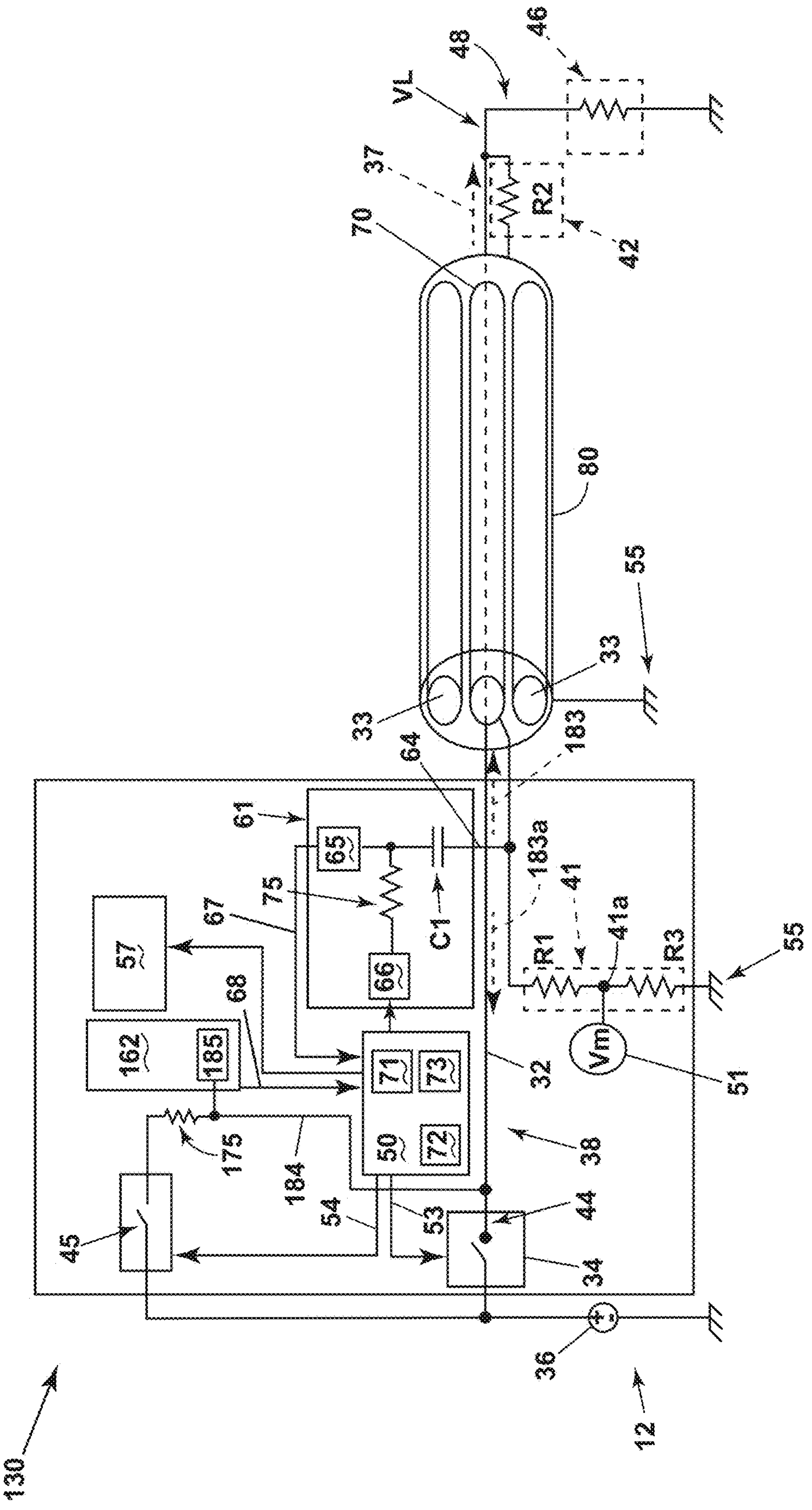
FIG. 3 is a schematic diagram of another fault detecting and locating apparatus in accordance with aspects as described herein.

FIG. 3 illustrates another arrangement of a fault detection and locating apparatus 130 in accordance with another aspect. The fault detecting and locating apparatus 130 can be provided at any appropriate location along the electrical wires (not shown), for example along the insulated supply conductor 32, such as an insulated shielded cable. The aspect of FIG. 3 is similar to that of FIG. 2, with the insulated supply conductor 32 circumferentially surrounded by a respective first conductive screen 70 extending from the supply end 38 to the load end 48. One notable difference to that of FIG. 2 being that the insulated supply conductor 32 is bundled within an electrically conductive overbraid or second conductive screen 80 with a set of shielded insulated supply conductors 33, each circumferentially surrounded by a respective first conductive screen 70. The second conductive screen 80 is electrically coupled to electrical ground 55 such as the aircraft structure 22. The second conductive screen 80 can define a known or predetermined impedance. The grounded second conductive screen 80 enables a further TDR capability to the fault detection and locating apparatus 130 to locate a short-circuit fault conditions between the respective first conductive screen 70 surrounding a respective insulated supply conductor 32 and electrical ground 55.

Another notable difference in the aspect of FIG. 3, from that depicted in FIG. 2, is that as shown, the fault detection and locating apparatus 130 can optionally include an auxiliary switching device 45. The auxiliary switching device 45 can be electrically coupled to the power supply 36 to receive the supply voltage Vs therefrom. The auxiliary switching device 45 can further be coupled to the insulated supply conductor 32 via a second reflection line 184. In non-limiting aspects, a second source impedance 175, having a known or predetermined value, can be coupled electrically in series between the auxiliary switching device 45 and the insulated supply conductor 32. For example, the value of the second source impedance 175 can be selected based on an impedance of the insulated supply conductor 32.

Additionally, aspects of the fault detection and locating apparatus 130 can include a second reflectometry module 162, which can include a second pulse detector 185. The second pulse detector 185 is communicatively coupled to the control module 50 via a communication line 68. The second reflectometry module 162 can be communicatively coupled to the second reflection line 184. The control module 50 can be communicatively coupled to the auxiliary switching device 45 and the second reflectometry module 162.

In non-limiting aspects, in the event the control module 50 determines a fault condition exists, the control module 50 can be further configured to provide a third signal 54 to the auxiliary switching device 45 to trigger an operation of the auxiliary switching device 45 to inject a second incident signal 183 (indicated by dashed arrow) such as a voltage pulse, to the insulated supply conductor 32. The auxiliary switching device 45 can provide the second incident signal 183 to the insulated supply conductor 32 via the second reflection line 184. In non-limiting aspects, the second incident signal 183 can be provided through the second source impedance 175. In non-limiting aspects, the auxiliary switching device 45 can comprise any desired switching device (e.g., a MOSFET) capable of selective operation, to provide the second incident signal 183 having a predetermined waveform. For example, in the non-limiting aspect illustrated, the auxiliary switching device 45 can provide a rapid rise voltage pulse, for example rising from zero volts to the supply voltage Vs, for a desired wavelength (e.g., 2.5 milliseconds). The characteristics of the second incident signal 183 can be selected based on any number of parameters specific to the particular power distribution system 12 and supply conductor 32. It is contemplated that the second incident signal 183 can comprise any desired predetermined duration (e.g., 2.5 milliseconds), rise time (e.g., 20 picoseconds), shape (e.g., square, rectangular, gaussian, etc.), and amplitude (e.g., 5 volts) without departing from the scope of the disclosure.

The second incident signal 183 will propagate at a known or predetermined velocity of propagation on the insulated supply conductor 32 toward the electrical load 46. Since the second resistive element 42 is coupled to the insulated supply conductor 32 at the load end 48 and to the first conductive screen 70 at the load end 48 the second incident signal 183 will propagate through the second resistive element 42 and into the first conductive screen 70. As will be appreciated, under circumstances in which there is a short-circuit fault condition between the respective first conductive screen 70 surrounding a respective insulated supply conductor 32 and electrical ground 55, a portion of the second incident signal 183 will reflect back to the second reflectometry module 162 from the fault as a reflection of the second incident signal 183 as a second reflected signal 183*a*. The second reflected signal 183*a* can be detected by the second pulse detector 185. The second reflectometry module 162 can provide an indication of the second reflected signal 183*a* to the control module 50. In non-limiting aspects, the indication of the second reflected signal 183*a* can include an indication of the waveform of the second reflected signal 183*a*, or an indication of a second elapsed time between the injection of the second incident signal 183 and the detection of the second reflected signal 183*a*, or both.

Based on the indication of the second reflected signal 183*a*, the control module 50 can determine the second elapsed time between the injection of the second incident signal 183 and the detection of the second reflected signal 183*a*. Additionally, the control module 50 can determine a location of the short-circuit fault condition based on the second elapsed time. In non-limiting aspects, the control module 50 can additionally, or alternatively, provide an instruction to the user interface 57 to display information indicative of the second reflected signal 183*a* (e.g., the waveform of the second reflected signal 183*a*), the second elapsed time, or both. In non-limiting aspects, the display can include a location of the fault condition with respect to the insulated supply conductor 32. In some aspects, a user can determine the location of the fault condition by viewing the information displayed by the user interface 57.

Figure 4:
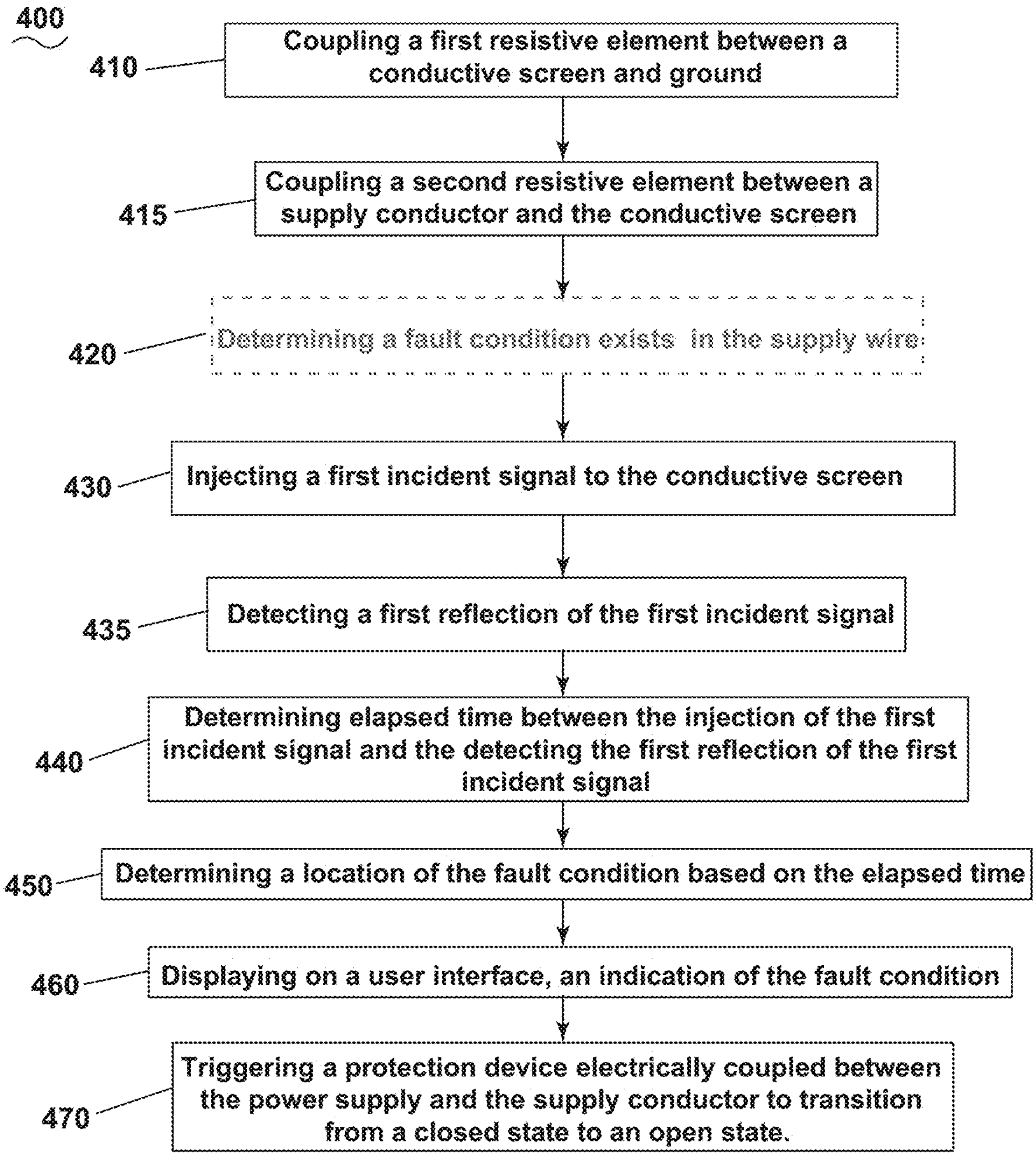
FIG. 4 depicts a flow diagram for a method for detecting and locating faults in accordance with aspects as described herein.

FIG. 4 illustrates a non-limiting example of a method 400 of locating a fault in an insulated supply conductor 32 in a power distribution system 12. While the method 400 will be described, for ease of understanding, with reference to the power distribution system of FIG. 1 and the fault detection and locating apparatus 30 of FIG. 2, aspects of the method 400 are not so limited and can be implemented in other power distribution systems without departing from the scope of the disclosure. The power distribution system 12 can include the power supply 36 configured to provide the supply voltage Vs to the electrical load 46 via the insulated supply conductor 32. The fault detection and locating apparatus 30 can be provided at any appropriate location along supply conductor 32. The fault detection and locating apparatus 30 can be electrically coupled to the electrical load 46, via the insulated supply conductor 32. The first conductive screen 70 can circumferentially surround the insulated supply conductor 32 with an insulator disposed between the insulated supply conductor 32 and the first conductive screen 70.

The fault detection and locating apparatus 30 can include the control module 50, protection device 34, first reflectometry module 61, first voltage sensor 51, first reflection line 64, first resistive element 41, and second resistive element 42. The first reflectometry module 61 can include the first signal generator 66 and the first pulse detector 65. The first reflectometry module 61 can be electrically coupled to the first conductive screen 70. The first signal generator is configured to generate a first incident signal 63. The first pulse detector 65 is configured to detect the first reflected signal 63*a*. The fault detection and locating apparatus 30 can be electrically coupled to the power supply 36 to receive the supply voltage Vs with respect to an electrical ground 55 or return path therefrom. The protection device 34, first reflectometry module 61 and first voltage sensor 51 can be communicatively coupled with the control module 50. The fault detection and locating apparatus 30 can optionally be communicatively coupled to a user interface 57 such as a display or monitor.

The insulated supply conductor 32 can extend between the first end and the second end where the first end is the load end 48 at the electrical load 46, and the second end is the supply end 38 at the power supply 36. The insulated supply conductor 32 can be coupled to the protection device 34 at the supply end 38. The protection device 34 can be electrically coupled between the power supply 36 and the insulated supply conductor 32. The protection device 34 can be communicatively coupled with the control module 50. The protection device 34 can include a switch 44 such as a circuit breaker, contactor, solid-state power controller (SSPC), and the like. The method 400 can be performed while the insulated supply conductor 32 is coupled to the power supply 36 or the electrical load 46, or both.

The method 400 can include, at 410, coupling the first resistive element 41 between the first conductive screen 70 and an electrical ground 55. The first resistive element 41 is coupled electrically in series between the first conductive screen 70 at the supply end 38 and electrical ground 55. The first resistive element 41 can define a relatively high impedance path from the first conductive screen 70 to electrical ground 55. In non-limiting aspects, the first resistive element 41 can be a first voltage divider comprising the first resistor R1 of known resistance coupled electrically in series with the third resistor R3 of known resistance at the node 41*a*. The first voltage sensor 51 can be configured to detect, measure, or otherwise sense the measured voltage Vm indicative of a voltage on the first conductive screen 70. For example, the first voltage sensor 51 can be electrically coupled in parallel with the first resistor R1 such that a voltage across the first resistor R1 is the measured voltage Vm.

The method 400 can include coupling the second resistive element 42 between the insulated supply conductor 32 and the first conductive screen 70, at 415. The second resistive element 42, can be a second resistor R2 of known resistance is coupled to the insulated supply conductor 32 at the load end 48 and to the first conductive screen 70 at the load end 48.

The method 400 can optionally include, at 420, determining a fault condition exists in the insulated supply conductor 32. For example, in non-limiting aspects, the determining the fault condition exists in the insulated supply conductor 32 with the control module 50. In non-limiting aspects, the determining the fault condition exists can be based on a comparison of the measured voltage Vm to a reference voltage Vr or threshold. The reference voltage Vr or threshold can be predetermined and saved in memory 72. For example, the reference voltage Vr can be calculated, derived, or otherwise determined based on the known supply voltage Vs at the supply end 38 and load voltage VL at the load end 48, respectively. The measured voltage Vm can be determined based on a voltage across the first resistor R1. Tin non-limiting aspects, the control module 50 can determine a fault condition exists when the value of the measured voltage Vm deviates from the value of reference voltage Vr, or the threshold is otherwise satisfied. The method 400 can include, for example, at 430, in the event the control module 50 determines a fault condition exists, injecting a first incident signal 63 to the first conductive screen 70. For example, the control module 50 can be configured to trigger an injection of the first incident signal 63 by the first signal generator 66 to the first conductive screen 70. The first signal generator 66 can generate the first incident signal 63, such as a voltage pulse, and provide the first incident signal 63 to the first conductive screen 70 via the first reflection line 64. The first incident signal 63 can be injected or provided through the first source impedance 75, or isolation capacitor C1, or both. The characteristics of the first incident signal 63 can be predetermined or selected based on any number of parameters specific to the particular power distribution system 12, supply conductor 32, first conductive screen 70, or combinations thereof. It is contemplated that the first incident signal 63 can comprise any desired predetermined duration (e.g., 2.3 milliseconds), rise time (e.g., 20 picoseconds), shape (e.g., square, rectangular, gaussian, etc.), and amplitude (e.g., 5 volts) without departing from the scope of the disclosure.

It is contemplated that in non-limiting aspects, the determining a fault condition exists in the insulated supply conductor 32, at 420, can be omitted, without departing from the scope of the disclosure. That is, in some instances a user may desire to inject the first incident signal 63 to the first conductive screen at 430, even in the absence of a detected fault. For example, a user may desire to inject the first incident signal 63 to the first conductive screen 70 by way of a "pre-close" or pre-energization" check on the insulated supply conductor 32. In such an instance, a fault condition could be identified and located prior to closing the switch 44.

The method 400 can include, at 435, detecting a first reflected signal 63*a*. The first reflected signal 63*a* can be a portion or reflection of the first incident signal 63 that is reflected or propagated back toward the first reflectometry module 61 due to a fault condition. The first reflected signal 63*a* can be detected by the first pulse detector 65. The first reflectometry module 61 can provide an indication of the first reflected signal 63*a* to the control module 50. In non-limiting aspects, the indication of the first reflected signal 63*a* can include an indication of the waveform or other characteristics of the first reflected signal 63*a* or an indication of an elapsed time between the injection of the first incident signal 63 and the detection of the first reflected signal 63*a*, or both.

The method 400 can further include, at 440, determining a first elapsed time between the injecting the first incident signal 63 and the detecting of the first reflected signal 63*a*. For example, the control module 50 can determine the first elapsed time between the injection of the first incident signal 63 and the detection of the first reflected signal 63*a*, based on the indication of the first reflected signal 63*a*.

The method can include, at 450, determining a location of the fault condition based on the first elapsed time. Non-limiting aspects of the method 400 can further include, at 460, displaying on the user interface 57, an indication of the fault condition. For example, the control module 50 can provide an instruction to the user interface 57 to display information indicative of the first reflected signal 63*a*. In non-limiting aspects, the information can include a location of the fault condition with respect to the insulated supply conductor 32. In some aspects, a user can determine the location of the fault condition by viewing the information displayed by the user interface 57.

Non-limiting aspects of the method 400 can further include, at 470, triggering the protection device 34 electrically coupled between the power supply 36 and the insulated supply conductor 32 to transition from a closed state to an open state.

The sequences depicted are for illustrative purposes only and is not meant to limit the method 400 in any way as it is understood that the portions of the method can proceed in a different logical order, additional or intervening portions can be included, or described portions of the method can be divided into multiple portions, or described portions of the methods can be omitted without detracting from the described method. For example, the method 400 can include various other intervening steps. The examples provided herein are meant to be non-limiting.

The disclosure discussed herein provides a solution for detecting and locating arcing or power loss within the electrical power wiring and connectors of a power distribution system. The fault detecting apparatus can detect and locate a failure in the wiring before there is significant energy loss and hence damage. Unlike conventional techniques, aspects as described herein can be implemented without need to disconnect the power wiring from the load, power supply, or both.

Aspects of this disclosure reduce workload of a maintenance personnel in determining a location of a fault condition on the insulated supply conductor. Aspects of the disclosure discussed herein minimize the likelihood of arc faults occurring within the power distribution system. Likewise, minimizing the likelihood of arc faults also minimizing maintenance requirements. The fault detecting apparatus as described herein can be utilized to perform necessary maintenance.

To the extent not already described, the different features and structures of the various embodiments may be used in combination with each other as desired. That one feature may not be illustrated in all of the embodiments and is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure.

To the extent not already described, the different features and structures of the various embodiments can be used in combination with each other as desired. That one feature is not illustrated in all of the embodiments is not meant to be construed that it may not be included, but is done for brevity of description. Thus, the various features of the different embodiments may be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Various characteristics, aspects and advantages of the present disclosure may also be embodied in any permutation of aspects of the disclosure, including but not limited to the following technical solutions as defined in the enumerated aspects:

An apparatus (30) to locate a fault condition in an insulated supply conductor (32) and a first conductive screen (70) surrounding the insulated supply conductor (32), the insulated supply conductor (32) coupled at a first end (48) to an electrical load (46) and coupled at a second end (38) to a power supply (36), the power supply (36) configured to provide a supply voltage (Vs) to the electrical load (46) via the insulated supply conductor (32), the apparatus (30) comprising: a first resistive element (41) coupled between the first conductive screen (70) and an electrical ground (55); a second resistive element (42) connected between the insulated supply conductor (32) and the first conductive screen (70) at the second end (38); a first reflectometry module (61) electrically coupled to the first conductive screen (70) via a first reflection line (64), the first reflectometry module (61) including a signal generator (66) configured to selectively inject a first incident signal (63) to the first conductive screen (70), and a first pulse detector (65) configured to detect a first reflected signal (63*a*) from the first incident signal (63) on the first reflection line (64); a voltage sensor (51) configured to detect a measured voltage (Vm) on the first conductive screen (70); and a control module (50) communicatively coupled to the reflectometry module (61) and voltage sensor (51), the control module (50) configured to: trigger an injection of the first incident signal (63) from the signal generator (66) to the first conductive screen (70); receive an indication of the first reflected signal (63*a*) from the first pulse detector (65); and determine a location of the fault condition based on the first reflected signal (63*a*).

The apparatus (30) of any preceding clause, wherein the control module (50) is further configured to: determine a first elapsed time between the injection of the first incident signal (63) and a detection of the first reflected signal (63*a*), and determine a location of the fault condition based on the first elapsed time.

The apparatus (30) of any preceding clause, wherein the control module (50) is further configured to receive a first indication of the measured voltage (Vm) from the voltage sensor (51), and to determine the fault condition exists based on a difference between the measured voltage (Vm) and a predetermined reference voltage (Vr).

The apparatus (30) of any preceding clause, wherein the control module (50) is configured to trigger the injection of the first incident signal (63) from the signal generator (66) to the first conductive screen (70) when the fault condition is determined.

The apparatus (30) of any preceding clause, further comprising a protection device (34) communicatively coupled with the control module (50), and electrically coupled between the power supply (36) and the insulated supply conductor (32), wherein the control module (50) is further configured to trigger the protection device (34) to transition from a closed state to an open state when the fault condition is determined.

The apparatus of any preceding clause, wherein the control module (50) is further configured to determine the location of the fault condition is between the insulated supply conductor (32) and the first conductive screen (70).

The apparatus (30) of any preceding clause, wherein the fault condition is an arc fault.

The apparatus (30) of any preceding clause, further comprising a user interface (57) communicatively coupled to the control module (50), wherein the control module (50) is further configured to cause the user interface (57) to display an indication of the fault condition.

The apparatus (30) of any preceding clause, wherein the indication of the fault condition includes a location of the fault condition.

The apparatus (30) of any preceding clause, wherein a resistance value of the first resistive element (41) is based on a reference voltage (Vr).

The apparatus (30) of any preceding clause, further comprising a second conductive screen (80) spaced from and circumscribing the first conductive screen (70), the second conductive screen (80) electrically coupled to the electrical ground (55); an auxiliary switching device (45) electrically coupled to the power supply (36) to receive the supply voltage (Vs) therefrom, the auxiliary switching device (45) coupled to the insulated supply conductor (32) via a second reflection line (184), and configured to selectively inject a second incident signal (183) to the insulated supply conductor (32) via the second reflection line (184); a second reflectometry module (162) electrically coupled to the second reflection line (184), the second reflectometry module (162) including a second pulse detector (185) configured to detect a second reflected signal (183*a*) from the second incident signal (183) on the second reflection line (184); the control module (50) further communicatively coupled to the second reflectometry module (162) and the auxiliary switching device (45), wherein the control module (50) further configured to: trigger an injection of the second incident signal (183) from the auxiliary switching device (45) to the insulated supply conductor (32); receive an indication of the second reflected signal (183*a*) from the second pulse detector (185); and determine a location of the fault condition based on the second reflected signal (183*a*).

The apparatus (30) of any preceding clause, wherein the control module (50) is further configured to: determine a second elapsed time between the injection of the second incident signal (183) and the detection of the second reflected signal (183*a*), and determine a location of the fault condition based on the second elapsed time.

The apparatus (30) of claim 11, wherein the second resistive element (42) is a resistor.

A method (400) of locating a fault condition in an insulated supply conductor (32) circumferentially surrounded by a first conductive screen (70), the insulated supply conductor (32) coupled at a first end (48) to an electrical load (46) and coupled at an opposing second end (38) to a power supply (36), the power supply (36) configured to provide a supply voltage (Vs) to the electrical load (46) via the insulated supply conductor (32), the method (400) comprising: coupling a first resistive element (41) between the first conductive screen (70) and an electrical ground (55); coupling a second resistive element (42) between the insulated supply conductor (32) and the first conductive screen (70) at the second end (38); injecting a first incident signal (63) to a supply end of the first conductive screen (70); detecting a first reflected signal (63*a*) from the first incident signal (63); determining a first elapsed time between the injection of the first incident signal (63) and the detecting the first reflected signal (63*a*); and determining a location of the fault condition based on the elapsed time.

The method (400) of any preceding clause, further comprising sensing a measured voltage (Vm) on the first conductive screen (70).

The method (400) of any preceding clause, further comprising determining a fault condition exists in the insulated supply conductor (32) based on the measured voltage (Vm).

The method (400) of any preceding clause, wherein the determining a fault condition exists is based on a difference between the measured voltage (Vm) and a predetermined reference voltage (Vr).

The method (400) of any preceding clause, further comprising displaying on a user interface (57), an indication of the fault condition.

The method (400) of any preceding clause, wherein the indication of the fault condition includes a location of the fault condition.

The method (400) of any preceding clause, further comprising triggering a protection device (34) electrically coupled between the power supply (36) and the insulated supply conductor (32) to transition from a closed state to an open state.

The invention claimed is:

1. An apparatus to locate a fault condition in a supply conductor and a first conductive screen surrounding the supply conductor, the supply conductor coupled at a first end to an electrical load and coupled at a second end to power supply, the power supply configured to provide a supply voltage to the electrical load via the supply conductor, the apparatus comprising:

a first resistive element coupled between the first conductive screen and an electrical ground;

a second resistive element connected between the supply conductor and the first conductive screen at the first end;

a first reflectometry module electrically coupled to the first conductive screen via a first reflection line, the first reflectometry module including a signal generator configured to selectively inject a first incident signal to the first conductive screen, and a first pulse detector configured to detect a first reflected signal from the first incident signal on the first reflection line;

a voltage sensor configured to detect a measured voltage on the first conductive screen; and a control module communicatively coupled to the first reflectometry module and voltage sensor, the control module configured to:

trigger an injection of the first incident signal from the signal generator to the first conductive screen;

receive an indication of the first reflected signal from the first pulse detector; and determine a location of the fault condition based on the first reflected signal.

2. The apparatus of claim 1, wherein the control module is further configured to:

determine a first elapsed time between the injection of the first incident signal and a detection of the first reflected signal, and determine a location of the fault condition based on the first elapsed time.

3. The apparatus of claim 1, wherein the control module is further configured to receive a first indication of the measured voltage from the voltage sensor, and to determine the fault condition exists based on a difference between the measured voltage and a predetermined reference voltage.

4. The apparatus of claim 3, wherein the control module is configured to trigger the injection of the first incident signal from the signal generator to the first conductive screen when the fault condition is determined.

5. The apparatus of claim 3, further comprising a protection device communicatively coupled with the control module, and electrically coupled between the power supply and the supply conductor, wherein the control module is further configured to trigger the protection device to transition from a closed state to an open state when the fault condition is determined.

6. The apparatus of claim 1, wherein the control module is further configured to determine the location of the fault condition is between the supply conductor and the first conductive screen.

7. The apparatus of claim 6, wherein the fault condition is an arc fault.

8. The apparatus of claim 1, further comprising a user interface communicatively coupled to the control module, wherein the control module is further configured to cause the user interface to display an indication of the fault condition.

9. The apparatus of claim 8, wherein the indication of the fault condition includes a location of the fault condition.

10. The apparatus of claim 1, wherein a resistance value of the first resistive element is based on a reference voltage.

11. The apparatus of claim 1, further comprising a second conductive screen spaced from and circumscribing the first conductive screen, the second conductive screen electrically coupled to the electrical ground;

an auxiliary switching device electrically coupled to the power supply to receive the supply voltage therefrom, the auxiliary switching device coupled to the supply conductor via a second reflection line, and configured to selectively inject a second incident signal to the supply conductor via the second reflection line;

a second reflectometry module electrically coupled to the second reflection line, the second reflectometry module including a second pulse detector configured to detect a second reflected signal from the second incident signal on the second reflection line;

the control module further communicatively coupled to the second reflectometry module and the auxiliary switching device, wherein the control module further configured to:

trigger an injection of the second incident signal from the auxiliary switching device to the supply conductor;

receive an indication of the second reflected signal from the second pulse detector; and determine a location of the fault condition based on the second reflected signal.

12. The apparatus of claim 11, wherein the control module is further configured to:

determine a second elapsed time between the injection of the second incident signal and the detection of the second reflected signal, and determine the location of the fault condition based on the second elapsed time.

13. The apparatus of claim 11, wherein the second resistive element is a resistor.

14. A method of locating a fault condition in an insulated supply conductor circumferentially surrounded by a first conductive screen, the insulated supply conductor coupled at a first end to an electrical load and coupled at an opposing second end to a power supply, the power supply configured to provide a supply voltage to the electrical load via the insulated supply conductor, the method comprising:

coupling a first resistive element between the first conductive screen and an electrical ground;

coupling a second resistive element between the insulated supply conductor and the first conductive screen at the first end;

electrically coupling a first reflectometry module to the first conductive screen via a first reflection line, the first reflectometry module including a signal generator configured to selectively inject a first incident signal to the first conductive screen, and a first pulse detector configured to detect a first reflected signal from the first incident signal on the first reflection line;

detecting a measured voltage on the first conductive screen with a voltage sensor;

communicatively coupling a control module to the first reflectometry module and the voltage sensor, the control module being configured to control an implementation of the steps of:

triggering an injection of the first incident signal from the signal generator to a supply end of the first conductive screen;

detecting a first reflected signal from the first incident signal on the first reflected line using the first pulse detector; and determining a location of the fault condition based on the first reflected signal.

15. The method of claim 14, further comprising determining a supply fault condition exists in the insulated supply conductor based on the measured voltage.

16. The method of claim 15, wherein the determining the supply fault condition exists is based on a difference between the measured voltage and a predetermined reference voltage.

17. The method of claim 14, further comprising displaying on a user interface, an indication of the fault condition.

18. The method of claim 17, wherein the indication of the fault condition includes a location of the fault condition.

19. The method of claim 14, further comprising triggering a protection device electrically coupled between the power supply and the insulated supply conductor to transition from a closed state to an open state.

* * * * *